United States Patent
Jain et al.

(10) Patent No.: US 11,855,642 B1
(45) Date of Patent: Dec. 26, 2023

(54) PROGRAMMABLE DELAY CIRCUIT INCLUDING THRESHOLD-VOLTAGE PROGRAMMABLE FIELD EFFECT TRANSISTOR

(71) Applicant: GlobalFoundries U.S. Inc., Malta, NY (US)

(72) Inventors: Navneet K. Jain, Milpitas, CA (US); Venkatesh P. Gopinath, Fremont, CA (US)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

(21) Appl. No.: 17/929,841

(22) Filed: Sep. 6, 2022

(51) Int. Cl.
*H03K 5/134* (2014.01)
*H03K 5/131* (2014.01)
*H03K 5/00* (2006.01)

(52) U.S. Cl.
CPC .............. *H03K 5/134* (2014.07); *H03K 5/131* (2013.01); *H03K 2005/00071* (2013.01); *H03K 2005/00221* (2013.01)

(58) Field of Classification Search
None
See application file for complete search history.

(56) References Cited

U.S. PATENT DOCUMENTS

| 5,886,920 | A | 3/1999 | Marshall et al. | |
| 9,614,507 | B2 | 4/2017 | Ankenapalli et al. | |
| 2003/0214339 | A1* | 11/2003 | Miyamoto | H03L 7/0814 327/276 |
| 2018/0026580 | A1* | 1/2018 | Zhang | H03B 5/1212 327/543 |

OTHER PUBLICATIONS

Kim et al.,"High-Performance and Area-Efficient Ferroelectric FET-Based Nonvolatile Flip Flops," Mar. 5, 2021, vol. 9, pp. 35549-35561.

Kościelnik et al. "Architecture of Successive Approximation Time-to-Digital Converter with Single Set of Delay Lines," Sep. 15-17, 2014, 20th IMEKO TC4 International Symposium and 18th International Workshop on ADC Modelling and Testing Research on Electric and Electronic Measurement for the Economic Upturn, pp. 341-346.

M.A. Abas et al., "Built-in time measurement circuits—a comparative design study," IET Comput. Digit. Tech., 2007, 1, (2), pp. 87-97.

* cited by examiner

*Primary Examiner* — Cassandra F Cox
(74) *Attorney, Agent, or Firm* — David Cain; Hoffman Warnick LLC

(57) ABSTRACT

A programmable delay structure includes at least one delay stage, each including an inverter connected between input and output nodes, a threshold voltage (VT)-programmable transistor, and a capacitor connectable to the output node through the transistor. During program mode operations, the transistor is programmed to have a low or high VT. During delay mode operation, the gate voltage is set between the low and high VTs. If the transistor has the low VT, the capacitor is connected to the output node and signal delay is increased. If the transistor has the high VT, the capacitor is not connected to the output node and signal delay is not increased. Illustrated embodiments include additional components for facilitating program mode and delay mode operations. Illustrated embodiments also include multiple delay stages where the output node of one stage is connected to the input node of the next. Also disclosed are associated operating methods.

20 Claims, 18 Drawing Sheets

N-type FEFET, Low VT Programming

N-type FEFET, High VT Programming

PROGRAM MODE AND NORMAL MODE SIGNALS IN PDL WITH
N-TYPE FEFET 225 AND NFET ACCESS DEVICES 221-222

Vp (e.g., 2.5-3.0V) >VDD (e.g., 1.0V)

Ve (e.g., 2.5-3.0V) >VDD (e.g., 1.0V)

|  | A | B | Wx | Rx | VLSx | CAP | Delay |
|---|---|---|---|---|---|---|---|
| Low VT Program Mode | Vp | GND | Vp plus VT of NFET 221 | GND | Vp | | |
| High VT Program Mode | GND | Ve | At Least VT Of NFET 221 (e.g., VDD) | GND | Ve | | |
| Normal Operation With Low VT | 0, 1 | 1, 0 | GND | VDD | VDD | Connected | CAP added delay |
| Normal Operation With High VT | 0, 1 | 1, 0 | GND | VDD | VDD | Not Connected | No CAP added delay |

FIG. 8A

PROGRAM MODE AND NORMAL MODE SIGNALS IN PDL WITH
N-TYPE FEFET 225 AND PFET ACCESS DEVICES 221-222

$V_p$ (e.g., 2.5-3.0V) >VDD (e.g., 1.0V)

$V_e$ (e.g., 2.5-3.0V) >VDD (e.g., 1.0V)

|  | A | B | Wx | Rx | VLSx | CAP | Delay |
|---|---|---|---|---|---|---|---|
| FEFET Low VT Program Mode | $V_p$ | GND | GND | $V_p$ | $V_p$ | | |
| FEFET High VT Program Mode | GND | $V_e$ | One VT below GND | $V_p$ | $V_e$ | | |
| FEFET Normal Operation With Low VT | 0, 1 | 1, 0 | VDD | GND | VDD | Connected | CAP added delay |
| FEFET Normal Operation With High VT | 0, 1 | 1, 0 | VDD | GND | VDD | Not Connected | No CAP added delay |

FIG. 8B

PROGRAM MODE AND NORMAL MODE SIGNALS IN PDL WITH
N-TYPE FEFET 225, NFET ACCESS DEVICE 221, AND PFET
ACCESS DEVICE 222

Vp (e.g., 2.5-3.0V) >VDD (e.g., 1.0V)

Ve (e.g., 2.5-3.0V) >VDD (e.g., 1.0V)

|  | A | B | Wx | Rx | VLSx | CAP | Delay |
|---|---|---|---|---|---|---|---|
| FEFET Low VT Program Mode | Vp | GND | Vp plus VT of FET 221 | Vp | Vp |  |  |
| FEFET High VT Program Mode | GND | Ve | At Least VT Of NFET 221 (e.g., VDD) | Vp | Ve |  |  |
| FEFET Normal Operation With Low VT | 0, 1 | 1, 0 | GND | GND | VDD | Connected | CAP added delay |
| FEFET Normal Operation With High VT | 0, 1 | 1, 0 | GND | GND | VDD | Not Connected | No CAP added delay |

FIG. 8C

PROGRAM MODE AND NORMAL MODE SIGNALS IN PDL
WITH N-TYPE FEFET 225, PFET ACCESS DEVICE 221, AND
NFET ACCESS DEVICE 222

Vp (e.g., 2.5-3.0V) >VDD (e.g., 1.0V)

Ve (e.g., 2.5-3.0V) >VDD (e.g., 1.0V)

|  | A | B | Wx | Rx | VLSx | CAP | Delay |
|---|---|---|---|---|---|---|---|
| FEFET Low VT Program Mode | Vp | GND | GND | GND | Vp |  |  |
| FEFET High VT Program Mode | GND | Ve | One VT below GND | GND | Ve |  |  |
| FEFET Normal Operation With Low VT | 0, 1 | 1, 0 | VDD | VDD | VDD | Connected | CAP added delay |
| FEFET Normal Operation With High VT | 0, 1 | 1, 0 | VDD | VDD | VDD | Not Connected | No CAP added delay |

FIG. 8D

PROGRAM MODE AND NORMAL MODE SIGNALS IN PDL WITH
N-TYPE FEFET 225, CMOS-BASED SWITCH ACCESS DEVICE 221
AND NFET ACCESS DEVICE 222

$V_p$ (e.g., 2.5-3.0V) > VDD (e.g., 1.0V)

$V_e$ (e.g., 2.5-3.0V) > VDD (e.g., 1.0V)

|  | A | B | Wx, Wxb | Rx | VLSx | CAP | Delay |
|---|---|---|---|---|---|---|---|
| FEFET Low VT Program Mode | $V_p$ | GND | $V_p$, GND FET 221 | GND | $V_p$ | | |
| FEFET High VT Program Mode | GND | $V_e$ | VDD, GND | GND | $V_e$ | | |
| FEFET Normal Operation With Low VT | 0, 1 | 1, 0 | GND, VDD | VDD | VDD | Connected | CAP added delay |
| FEFET Normal Operation With High VT | 0, 1 | 1, 0 | GND, VDD | VDD | VDD | Not Connected | No CAP added delay |

FIG. 8E

PROGRAM MODE AND NORMAL MODE SIGNALS IN PDL WITH
N-TYPE FEFET 225, CMOS-BASED SWITCH ACCESS DEVICE 221
AND PFET ACCESS DEVICE 222

Vp (e.g., 2.5-3.0V) >VDD (e.g., 1.0V)

Ve (e.g., 2.5-3.0V) >VDD (e.g., 1.0V)

|  | A | B | Wx, Wxb | Rx | VLSx | CAP | Delay |
|---|---|---|---|---|---|---|---|
| FEFET Low VT Program Mode | Vp | GND | Vp, GND FET 221 | Vp | Vp | | |
| FEFET High VT Program Mode | GND | Ve | VDD, GND | Vp | Ve | | |
| FEFET Normal Operation With Low VT | 0, 1 | 1, 0 | GND, VDD | GND | VDD | Connected | CAP added delay |
| FEFET Normal Operation With High VT | 0, 1 | 1, 0 | GND, VDD | GND | VDD | Not Connected | No CAP added delay |

FIG. 8F

PROGRAMMABLE DELAY CIRCUIT INCLUDING THRESHOLD-VOLTAGE PROGRAMMABLE FIELD EFFECT TRANSISTOR

BACKGROUND

Field of the Disclosure

The present disclosure relates to delay circuits and, more particularly, to embodiments of a programmable delay structure and to associated operating methods.

Description of Related Art

Delay circuits can be incorporated into integrated circuit (IC) designs to, for example, provide some amount of output signal delay (i.e., to delay an output signal by some amount of time in order to ensure proper circuit operation). In such delay circuits, the amount of signal delay is typically a function of resistance and/or capacitance. Programmable delay circuits have been developed where the amount of signal delay (e.g., due to the amount of resistance and/or capacitance) can be selectively adjusted in order to, for example, compensate for process variations, provide hold time fixes, etc. However, typically such programmable delay circuits are controlled digitally by externally stored binary control bits.

SUMMARY

In view of the foregoing, disclosed herein disclosed herein are embodiments of a programmable delay structure including one or more programmable delay stages (PDLs), where each PDL includes a transistor with a threshold voltage (VT) that is programmable (e.g., either low or high) in order to selectively adjust the signal delay within that PDL and to do so without relying on externally stored binary control bits.

Generally, each of the disclosed programmable delay structure embodiments can include at least one PDL. The PDL can include an input node, an output node, and an inverter connected between the input node and the output node. The PDL can further include a capacitor and a VT-programmable transistor with source/drain regions connected to the output node and the capacitor such that the capacitor is electrically connectable to the output node through the VT-programmable transistor.

Some embodiments of the disclosed programmable delay structure embodiments can include multiple PDLs. That is, in these embodiments, the programmable delay structure can include an input terminal, an output terminal, and the PDLs connected in series between the input terminal and the output terminal. Each PDL can include a stage input node, a stage output node, and an inverter connected between the stage input node and the stage output node. Each PDL can further include a capacitor and a VT-programmable transistor with source/drain regions connected to the stage output node and the capacitor such that the capacitor is electrically connectable to the stage output node through the VT-programmable transistor. In these embodiments, the stage output node of one PDL and the stage input node of an adjacent downstream PDL are electrically connected.

In each of the embodiments, the VT of the VT-programmable transistor is programmable so that it is either low or high. If it is low, then, during delay mode operations, the capacitor will be connected to the output node and signal delay is increased due to capacitance. If it is high, then, during delay mode operations, the capacitor will not be connected to the output node and signal delay will not be increased.

BRIEF DESCRIPTION OF THE SEVERAL VIEWS OF THE DRAWINGS

The present disclosure will be better understood from the following detailed description with reference to the drawings, which are not necessarily drawn to scale and in which:

FIGS. 8A-8F are tables illustrating signals for program mode and delay mode operations in the disclosed programmable delay structure embodiments of FIGS. 2A-2F.

DETAILED DESCRIPTION

Figure 1:
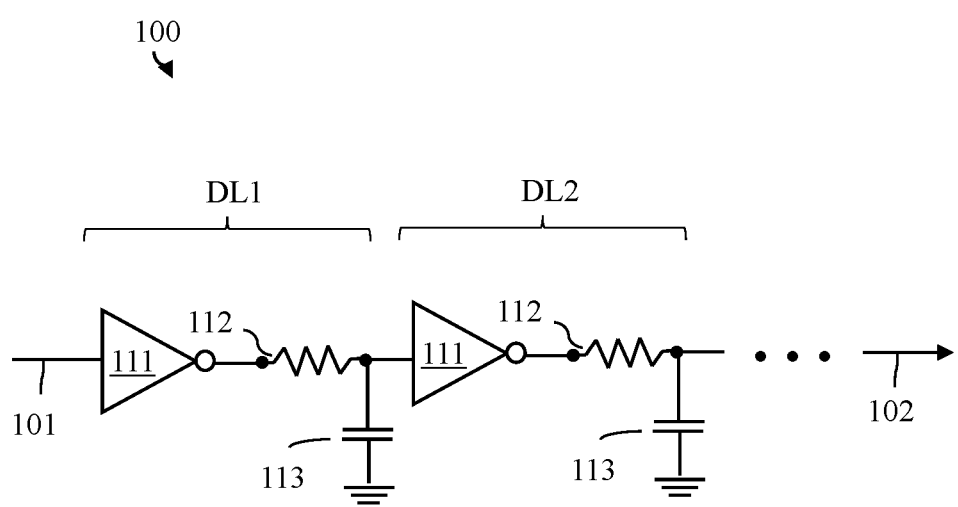
FIG. 1 is a schematic diagram illustrating a conventional delay circuit.

As mentioned above, delay circuits can be incorporated into integrated circuit (IC) designs to, for example, provide some amount of output signal delay (i.e., to delay an output signal by some amount of time in order to ensure proper circuit operation). FIG. 1 is a schematic diagram illustrating a conventional delay circuit 100 with an input terminal 101 and an output terminal and including multiple delay stages (e.g., DL1, DL2, . . . ) connected in series between the input terminal and the output terminal. Each delay stage can include: an inverter 111; a resistor 112 connected between the inverter 111 and a stage output node; and a capacitor 113 connected between the stage output node and ground. The stage input node of a downstream stage can be connected to the stage output node of the adjacent upstream stage. That is, the stage input node of DL2 is connected to the stage output node of DL1, and so on. In such a delay circuit 100, the amount of resistance-capacitance (RC) delay within each delay stage is a function of the total resistance in the stage (e.g., the resistance of the inverter 111 plus the resistance of the resistor 112) times the capacitance of the capacitor 113. Additionally, programmable delay circuits have been developed where the amount of signal delay (e.g., due to the amount of resistance and/or capacitance) can be selectively adjusted in order to, for example, compensate for process variations, provide hold time fixes, etc. However, typically such programmable delay circuits are controlled digitally by externally stored binary control bits.

In view of the foregoing, disclosed herein disclosed herein are embodiments of a programmable delay structure including one or more programmable delay stages (PDLs), where each PDL includes a transistor with a VT that is programmable (e.g., either low or high) in order to selectively adjust the signal delay within that PDL and to do so without relying on externally stored binary control bits. Specifically, in the disclosed embodiments, each PDL can include an inverter connected between an input node and an output node, a VT-programmable transistor (e.g., a ferroelectric field effect transistor (FEFET) or a charge trap field effect transistor (CTFET)), and a capacitor that is electrically connectable to the output node through the VT-programmable transistor. During program mode operations, the VT-programmable transistor is programmed so as to have either a first VT (i.e., the low VT) or a second VT (i.e., high VT). During delay mode (also referred to herein as normal mode or mission mode) operation, a gate voltage on the VT-programmable transistor is set between the low and high VTs. If the VT-programmable transistor has the low VT, the capacitor is connected to the output node and signal delay is increased due to capacitance. If the VT-programmable transistor has the high VT, the capacitor is not connected to the output node and signal delay is not increased. Illustrated embodiments include additional circuit components that can be employed for program mode and delay mode operations (e.g., depending upon the specific type of VT-programmable transistor and also on the conductivity type of the VT-programmable transistor). Illustrated embodiments also include multiple PDLs where the output node of one PDL is connected to the input node of the adjacent downstream PDL. Also disclosed herein are method embodiments for operating the disclosed programmable delay structure embodiments in the program and delay modes.

More particularly, referring to FIGS. 2A-2F, disclosed herein are embodiments of a programmable delay structure 200A-200F, respectively. In each of the embodiments, the programmable delay structure 200A-200F can include at least one programmable delay stage (PDL) (e.g., see the first programmable delay stage (PDL1), the second programmable delay stage (PDL2), and so on). For purposes of illustration, two PDLs are shown in FIGS. 2A-2F. However, it should be understood that these figures are not intended to be limiting and that, alternatively, the programmable delay structure 200A-200F can include any number of one or more PDLs. In a programmable delay structure with multiple PDLs, the PDLs can be connected in series between an input terminal 201 and an output terminal 202.

Each PDL can be configured to add RC delay, as discussed above, to a data signal as the data signal passes therethrough. Specifically, each PDL can include a stage input node 231 and a stage output node 232. In the case of multiple PDLs, the stage input node 231 of a downstream stage can be electrically connected to the stage output node 232 of the adjacent upstream stage. Thus, for example, as illustrated in FIGS. 2A-2F the stage input node 231 of PDL2 is electrically connected to the stage output node 232 of PDL1.

Each PDL can further include an inverter 211 connected between the stage input node 231 and the stage output node 232 and having a variable power supply 215. FIG. 3 is a schematic diagram illustrative of an inverter 211 that can be incorporated into each PDL. The inverter 211 can include a P-type field effect transistor (PFET) 311 and an N-type field effect transistor (NFET) 312 connected in series between a voltage rail 321 (which is connected to a variable power supply 215) and ground 322. The gate structures of the PFET 311 and NFET 312 can be connected at node 301, which is electrically connected to the stage input node 231. Additionally, the junction 302 between the PFET 311 and NFET 312 can be electrically connected to the stage output node 232. Referring again to FIGS. 2A-2F, the variable power supply 215 for the inverter 211 can be configured to selectively supply at least two different voltages to the inverter 211. The different supply voltages can include a first positive voltage (e.g., a delay mode positive supply voltage (VDD) at, for example, 1.0V), a second positive voltage that is greater than the first positive voltage (e.g., a program mode positive supply voltage (Vp) at, for example, 2.5-3.0V, such as 2.5V), a third positive voltage (e.g., an erase mode positive supply voltage (Ve) at, for example, 2.5V-3.0V but optionally different from, such as greater than, Vp), and optionally some other positive voltage level, as discussed in greater detail below. Various different variable power supply circuits capable of outputting different voltages in response to different control signals are well known in the art. Thus, the details of such variable power supply circuits have been omitted from this specification in order to allow the reader to focus on the salient aspects of the disclosed embodiments.

Each PDL can further include a VT-programmable transistor 225 (i.e., a transistor having a programmable VT). The VT-programmable transistor 225 can be, for example, a field effect transistor (FET) (e.g., an N-type field effect transistor (NFET), as illustrated, or a P-type field effect transistor (PFET)) configured for electric field-induced VT switching (as opposed to current-induced VT switching) between a first VT (e.g., a low VT) and a second VT (e.g., a high VT) that is different from the first VT and, particularly, that is higher than the first VT. For example, if the VT-programmable transistor 225 is an NFET configured for electric field-induced VT switching, then the VT of the NFET can be programmable to a relatively low VT, such as a VT of 0V or some other low VT, or to a relatively high VT, such as a VT of 1.5V or some VT that is higher than the low VT.

FETs that are configured for electric field-induced VT switching and that could be incorporated into the PDL(s) of the programmable delay structure 200A-200F include, but are not limited to, ferroelectric field effect transistors (FEFETs) and charge trap field effect transistors (CTFETs).

Figure 4A:
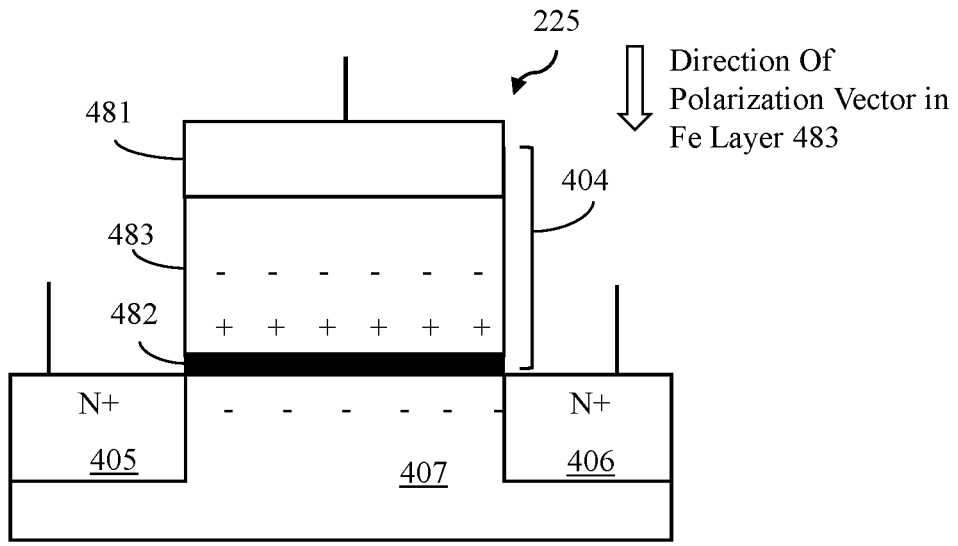
FIGS. 4A and 4B are cross-section diagrams illustrating different VT states of an N-type ferroelectric field effect transistor (FEFET)
Figure 4B:
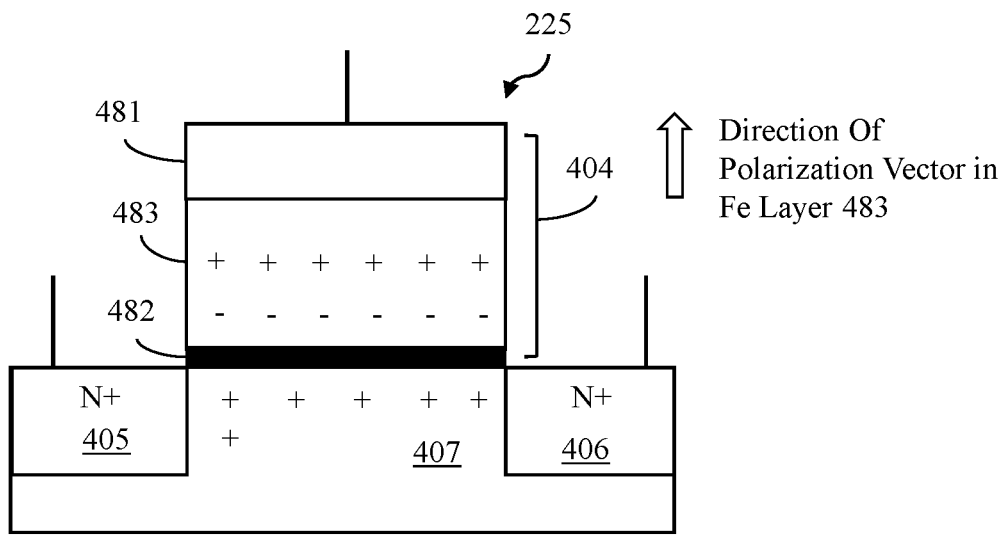

FIGS. 4A and 4B are cross-section diagrams illustrating different VT states of an N-type FEFET that can be incorporated into a PDL as a VT-programmable transistor 225. This N-type FEFET can include a semiconductor layer (e.g., a silicon layer or a layer of some other suitable semiconductor material) and, within and/or on the semiconductor layer, N+ source/drain terminals 405-406 and a channel region 407 (e.g., an intrinsic or P-channel region, depending upon the process technology at issue) positioned between the N+ source/drain terminals 405-406. The N-type FEFET can further include a gate terminal 404 adjacent to the channel region 407. This gate terminal 404 can be a multi-layered structure including, for example, a gate dielectric layer 482 on the channel region 407, a ferroelectric layer 483 (e.g., a hafnium oxide layer or some other suitable ferroelectric layer) on the gate dielectric layer 482, and a control gate layer 481 (e.g., a metal gate layer) on the ferroelectric layer 483. With such a gate terminal 404, the N-type FEFET has an electric field-based programmable VT and, particularly, has a VT that can be set at a first VT (i.e., a low VT, such as a VT of 0V) or a second VT that is higher than the first VT (i.e., a high VT, such as a VT of 1.5V) depending upon the bias conditions on the gate terminal 404 and at least one of the source/drain terminals 405-406. Those skilled in the art will recognize that setting the VT at the first VT is a process often referred to as a writing or programming process, whereas setting the VT at the second VT that is higher than the first VT is often referred to as an erasing process.

To achieve electric field-induced switching to the first VT, the FEFET can be operated in a first program mode (also referred to herein as a low VT program mode), during which Vp that is, for example, within the range of approximately 2.5V to approximately 3.0V can be applied to the gate terminal 404 and a ground voltage pulse (GND) of, for example, 0V can be applied to at least one of the N+ source/drain terminals 405-406. This results in the direction of polarization vector of the ferroelectric layer 483 pointing toward the channel region 407 (i.e., it results in + poles of dipoles in the layer 483 being adjacent to the channel region 407 and − poles of the dipoles being adjacent to the control gate layer 481) such that electrons are attracted to the channel region 407, thereby setting the VT at the first VT (see FIG. 4A). When the first VT is set, the channel region 407 between the N+ source/drain terminals 405-406 will become conductive in response to a delay mode gate voltage pulse subsequently applied to the gate terminal 404 and set between the first VT and the second VT (and significantly lower than Vp).

To achieve electric field-induced switching to the second VT, the FEFET can be operated in a second program mode (also referred to herein as a high VT program mode or an erase mode). In the second program mode, GND can be applied to the gate terminal 204 and Ve that is, for example, within the range of approximately 2.5V to approximately 3.0V can be applied to at least one of the N+ source/drain terminals 405-407. Alternatively, a negative voltage pulse can be applied to the gate terminal 404 and GND can be applied to at least one of the N+ source/drain terminals 405-406. Either way, this results in the direction of polarization vector of the ferroelectric layer 483 pointing toward the control gate layer 481 (i.e., it results in + poles of dipoles in the layer 483 being adjacent to the control gate layer 481 and − poles of the dipoles being adjacent to the channel region 407) such that electrons are repelled from channel region 407, thereby setting the VT up at the second VT (see FIG. 4B). When the second VT is set, the channel region 407 will remain non-conductive in response to the same delay mode gate voltage pulse (as mentioned above) subsequently applied to the gate terminal 404. It should be noted that Ve can be at the same voltage level as Vp (e.g., Vp=Ve=2.5V) or at a different level (e.g., Ve≥Vp=2.5V), but in any case, the delay mode gate pulse should be significantly lower than Vp and Ve to avoid unintended VT switching.

Figure 5A:
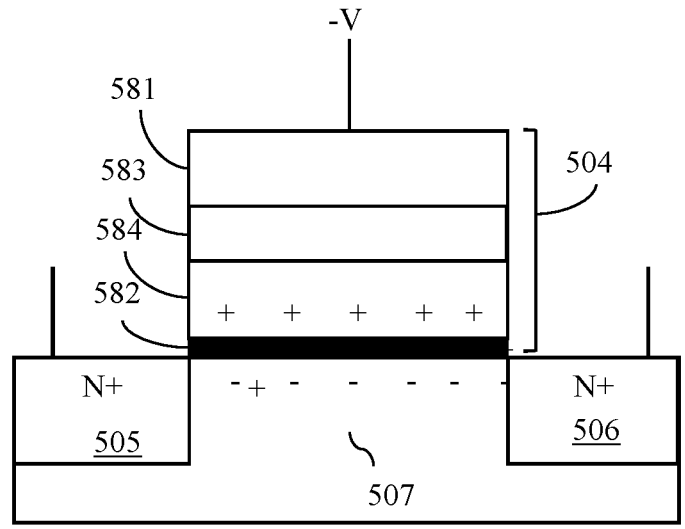
FIGS. 5A and 5B are cross-section diagrams illustrating different VT states of an N-type charge trap field effect transistor (CTFET)
Figure 5B:
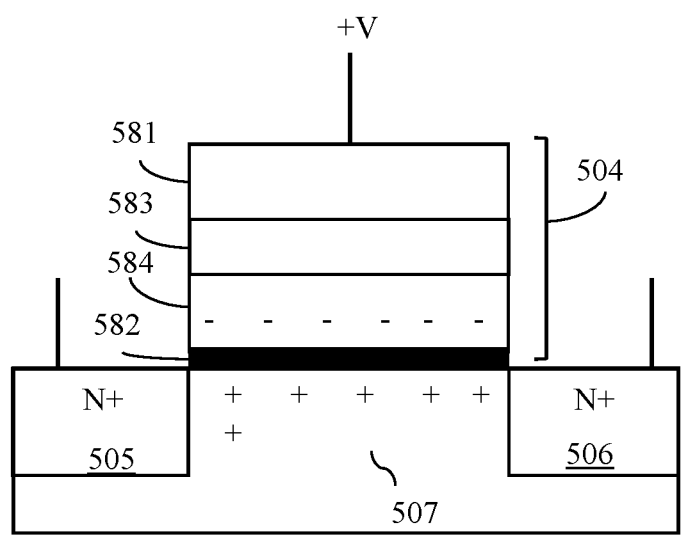

FIGS. 5A and 5B are cross-section diagrams illustrating different VT states of an N-type CTFET that could, alternatively, be incorporated into a PDL as a VT-programmable transistor 225. This N-type CTFET can include a semiconductor layer (e.g., a silicon layer or a layer of some other suitable semiconductor material) and, within and/or on the semiconductor layer, N+ source/drain terminals 505-506 and a channel region 507 (e.g., an intrinsic or P-channel region, depending upon the process technology at issue) positioned between the N+ source/drain terminals 505-506. The N-type CTFET can further include a gate terminal 504 adjacent to the channel region 507. The gate terminal 504 can be a multi-layered structure including, for example, a gate dielectric layer 582 on the channel region 507, a charge trap layer 584 (e.g., a silicon nitride layer or some other suitable charge trap layer) on the gate dielectric layer 582, another gate dielectric layer 583 on the charge trap layer 584 and a control gate layer 581 (e.g., a metal gate layer) on the gate dielectric layer 583. With such a gate terminal 504, the N-type CTFET has an electric field-based programmable VT and, particularly, a VT that can be set at a first VT (i.e., a low VT, such as a VT of 0V) or a second VT that is higher than the first VT (i.e., a high VT, such as a VT of 1.5V) depending upon the bias conditions on the gate and source/drain terminals.

To achieve electric field-induced switching to the first VT, the CTFET can be operated in a first program mode (also referred to as a low VT program mode). In the first program mode, a negative voltage (−Vp) can be applied to the gate terminal 504 and Vp can be applied to at least one of the N+ source/drain terminals 505-506. This results in electrons moving out of the charge trap layer 584, thereby setting the VT at the first VT (see FIG. 5A). When the first VT is set, the channel region 507 between the N+ source/drain terminals 505-506 becomes conductive in response to a delay mode gate voltage pulse subsequently applied to the gate terminal 504 and set between the first VT and the second VT.

To achieve electric field-induced switching to the second VT, the CTFET can be operated in a second program mode (also referred to as a high VT program mode or an erase mode). In the second program mode, Ve can be applied to the gate terminal 304 and a negative voltage (−Ve) can be applied to at least one of the N+ source/drain terminals 505-506. This results in electrons moving into and being trapped by the charge trap layer 584, thereby setting the VT up at the second VT (see FIG. 4B). When the second VT is set, the channel region 507 between the N+ source/drain terminals 505-506 will remain non-conductive in response to the same delay mode gate voltage pulse subsequently applied to the gate terminal 504. It should be noted that the absolute value of Ve can be the same as the absolute value Vp or at a different level, but in any case, the delay mode gate pulse should be significantly lower than Vp and Ve to avoid unintended VT switching.

Referring again to FIGS. 2A-2F, each PDL can also include a capacitor 213, which is electrically connectable to the stage output node 232 through the VT-programmable transistor 225. Specifically, the VT-programmable transistor 225 can have source/drain regions connected to the stage output node 232 and the capacitor 213, respectively, and a gate structure. If the VT-programmable transistor 225 is an NFET, then the source region can be connected to the capacitor 213 and the drain region can be connected to the stage output node 232, as illustrated.

Figure 6A:
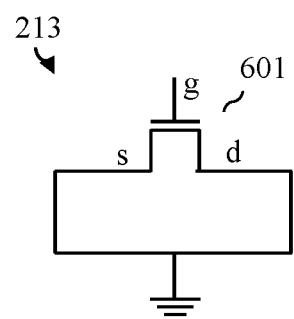
FIGS. 6A and 6B are schematic diagrams illustrating capacitors.
Figure 6B:
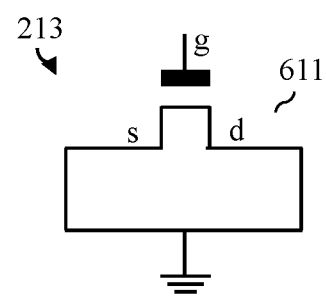

As mentioned above, each PDL can add RC delay to a data signal as the data signal passes therethrough. The capacitor 213, if/when electrically connected to the stage output node 232 by the VT-programmable transistor 225 (e.g., if the VT-programmable transistor 225 is switched to an on-state and thereby conductive), can add signal delay. The capacitor 213 can be any suitable capacitor structure. For example, as illustrated in FIG. 6A, the capacitor 213 can be a metal oxide semiconductor (MOS) capacitor 601. Such a MOS capacitor can include a metal oxide semiconductor field effect transistor (MOSFET) with a gate structure (g) electrically connected to the VT-programmable transistor 225 and with source and drain regions (s and d) both connected to GND. Alternatively, as illustrated in FIG. 6B, the capacitor 213 could be a VT-programmable FET-based capacitor 611. Such a VT-programmable FET-based capacitor 611 could include a VT-programmable FET (e.g., a FEFET or CTFET as described above) where the gate structure (g) is connected to the VT-programmable transistor 225 and where the source and drain regions (s and d) are connected to GND. In this case, the capacitance of the capacitor could be selectively adjusted based on the programmed VT. Alternatively, the capacitor 213 could be any other suitable type of capacitor including, but not limited to, a metal insulator metal (MIM) capacitor or a metal oxide metal (MOM) capacitor connected between the VT-programmable transistor 225 and GND. Such MIM and MOM-type capacitors are well known in the art and, thus, the details thereof have been omitted from this specification in order to allow the reader to focus on the salient aspects of the disclosed embodiments.

It should be noted that, in the case of multiple PDLs, the capacitors 213 in the different PDLs can all be essentially the same (e.g., can be the same type, with the same specifications, such as the same size, materials, etc. so as to have essentially the same capacitance values). Alternatively, two or more of the capacitors 213 in two or more of the PDLs, respectively, can be different (e.g., can be different types of capacitors and/or can have different specifications so as to have different capacitance values). Thus, across multiple PDLs, the potential capacitance component of the RC delay in each PDL (if/when the capacitor is connected by the VT-programmable transistor to the stage output node) can either be the same or different.

Referring again to FIGS. 2A-2F, each PDL can also include a resistor 212 connected between the inverter 211 and the stage output node 232. The resistor 212 can simply be the interconnect (e.g., a wire) that provides the connection between the inverter 211 and the stage output node 232. Alternatively, the resistor 212 could include a combination of interconnect(s) and some other integrated resistive element(s). As mentioned above, each PDL can add RC delay as a data signal passes therethrough. The resistor 212 can, thus, add to the signal delay. In the case of multiple PDLs, the resistors 212 within the different PDLs could have the same resistance values. Alternatively, two or more resistors 212 in two or more PDLs could have different resistance values. That is, the resistors 212 across all PDLs can be essentially the same (e.g., can have the same design, with the same specifications, etc. so as to essentially the same resistance values). Alternatively, two or more resistors 212 in two or more PDLs can be different (e.g., can be different types of resistors and/or can have different specifications so as to have different resistance values). Thus, across multiple PDLs, the potential resistance component of the RC delay in each PDL can either be the same or different.

The programmable delay structure 200A-200F can be configured so that the PDLs concurrently operate in a delay mode (i.e., perform delay mode operation) during which a data input signal is received at the input terminal 201, the data input signal is passed through the PDLs in sequence and inverted and delayed by each PDL, and a delayed data output signal is output at the output terminal 202. It should be understood that, depending upon the number of PDLs, the delayed data output signal at the output terminal 292 may or may not also be inverted with respect to the data input signal at the input terminal 201. The programmable delay structure 200A-200F can further be configured so that the PDLs are selectively and individually operable in a program mode for either first VT programming (i.e., for programming the VT-programmable transistor 225 therein to have a first VT and, particularly, a low VT) or second VT programming (i.e., for programming the VT-programmable transistor 225 therein to have a second VT and, particularly, a high VT). More specifically, the programmable delay structure 200A-200F and each PDL therein can also include additional circuitry to facilitate delay mode operation and program mode operations.

This additional circuitry can include, within each PDL, two access devices and, particularly, a first access device 221 for program mode operations and a second access device 222 for delay mode operation. The first access device 221 can be connected between the input node 231 and the gate structure of the VT-programmable transistor 225. The first access device 221 can further be controlled by a stage-specific program mode control signal (W) (e.g., see W1 in PDL1, W2 in PDL2, and so on). As discussed in greater detail below, control of the first access device may require both W and Wb (i.e., an inverted W). The second access device 222 can be connected between a power supply 216 (e.g., a fixed power supply, such as a fixed positive voltage rail at a first positive voltage, such as at VDD, e.g., 1.0V) and the gate structure of the VT-programmable transistor 225 and can further be controlled by a stage-specific delay mode control signal (R) (e.g., see R1 in PDL1, R2 in PDL2, and so on). The different programmable delay structures 200A-200F differ with regard to the types of access devices that can be employed.

Figure 2A:
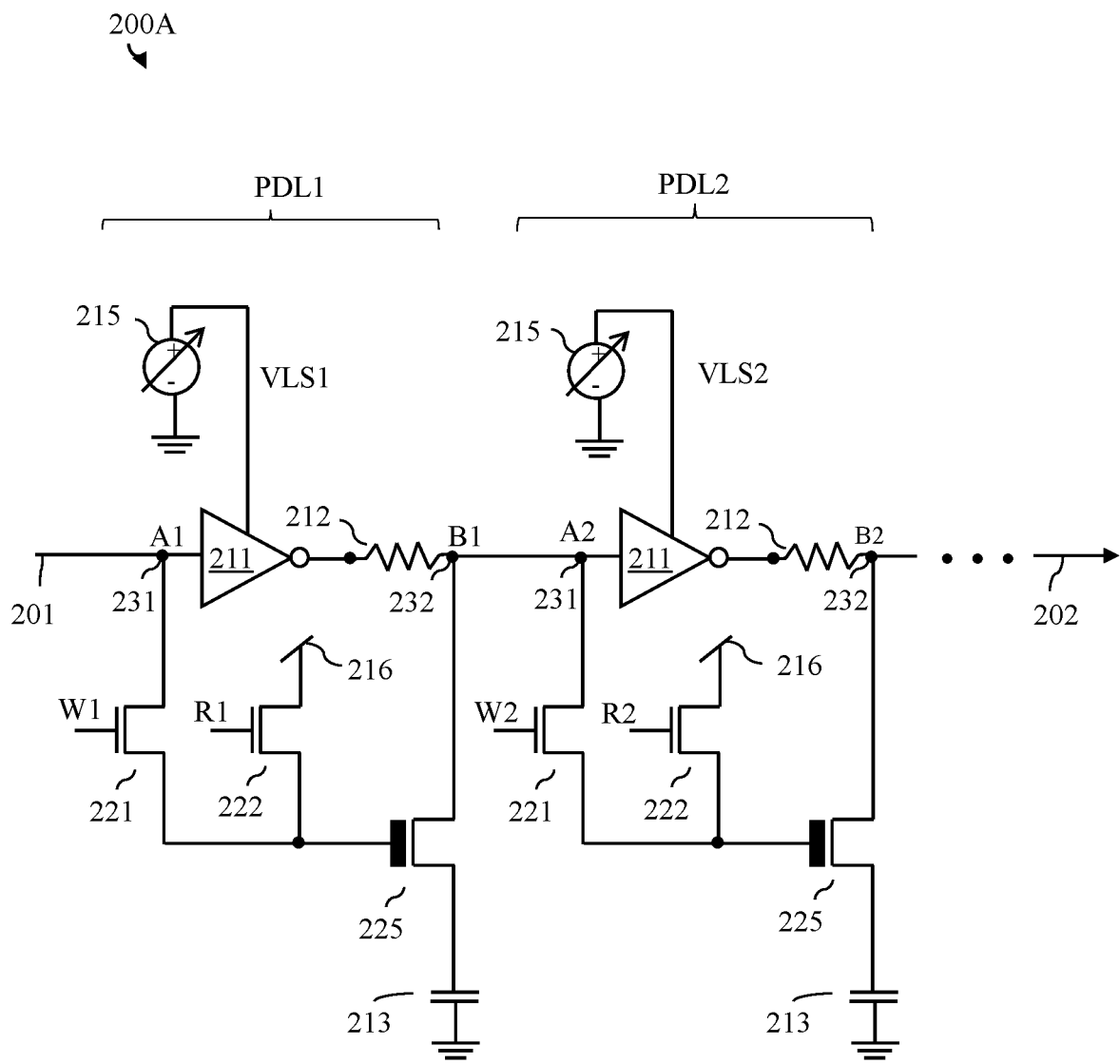
FIGS. 2A-2F are schematic diagrams illustrating disclosed embodiments, respectively, of a programmable delay structure.

For example, as illustrated in each PDL of the programmable delay structure 200A of FIG. 2A, the first and second access devices 221-222 can be first and second NFETs, respectively, with gate structures controlled by Wx and Rx, respectively. Alternatively, as illustrated in each PDL of the programmable delay structure 200B of FIG. 2B, the first and second access devices 221-222 can be first and second PFETs, respectively, with gate structures controlled by Wx and Rx, respectively. Alternatively, as illustrated in each PDL of the programmable delay structure 200C of FIG. 2C, the first access device 221 can be an NFET with a gate structure controlled by Wx and the second access device 222 can be a PFET with a gate structure controlled by Rx. Alternatively, as illustrated in each PDL of the programmable delay structure 200D of FIG. 2D, the first access device 221 can be a PFET with a gate structure controlled by Wx and the second access device 222 can be an NFET with a gate structure controlled by Rx. Alternatively, as illustrated in each PDL of the programmable delay structure 200E of FIG. 2E, the first access device 221 can be a complementary metal oxide semiconductor (CMOS)-based switch (also referred to herein as a transmission gate) with gate structures as discussed in greater detail below controlled by Wx and Wbx and the second access device 222 can be an NFET with a gate structure controlled by Rx. Alternatively, as illustrated in each PDL of the programmable delay structure 200F of FIG. 2F, the first access device 221 can be CMOS-based switch (i.e., a transmission gate) with gate structures controlled by Wx and Wbx (as discussed below) and the second access device 222 can be a PFET with a gate structure controlled by Rx. It should be noted that the CMOS-based switches of the PDLs of the programmable delay structures 200E and 200F can include both an NFET and a PFET connected in parallel between the stage input node 231 and the gate structure of the VT-programmable transistor 225 and, for purposes of illustration, the gate structure of the NFET of the CMOS-based switch can be controlled by Wx and the gate structure of the PFET of the CMOS-based switch can be controlled by Wbx (which as mentioned above is inverted with respect to Wx).

In any case, in each of these embodiments, the first and second access devices 221-222 are configured to enable the required bias conditions to be applied to the gate structure of the VT-programmable transistor 225 to achieve low VT or high VT programming during program mode operations or to facilitate signal delay during delay mode operation. Wx (Wxb) and Rx will vary depending upon the mode of operation, upon the type of VT-programmable transistor 225 as well as the type of access devices employed. It should be noted that the additional circuitry in each PDL can also include the variable power supply 215, mentioned above, for the inverter 211 to enable switching of the variable power supply 215 between different positive voltages during program mode and delay mode operations, as discussed in greater detail below. The additional circuitry can also include multiplexing circuitry (not shown) to enable switching of the signal at the input terminal 201 between a data input signal during delay mode operation and one of two different programming input signals during program mode operations, as discussed in greater detail.

Figure 7:
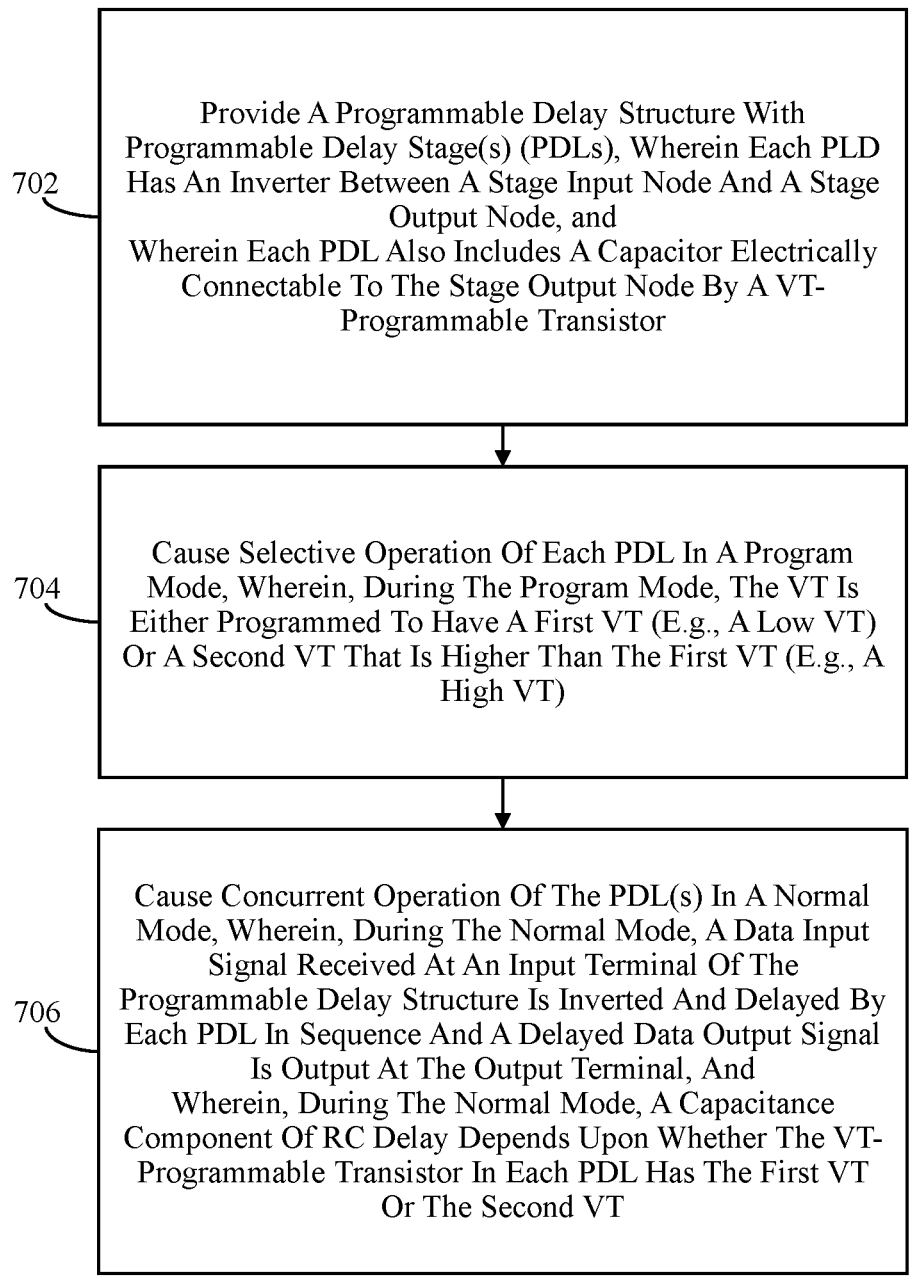
FIG. 7 is a flow diagram illustrating disclosed method embodiments.

Referring to the flow diagram of FIG. 7, also disclosed herein are method embodiments for operating the disclosed programmable delay structure embodiments in program and delay modes.

The method embodiments can include providing a programmable delay structure, such as any of the disclosed programmable delay structures 200A-200F of FIGS. 2A-2F, described in detail above (see process 702).

The method embodiments can further include causing selective operation of PDL in a program mode (see process 704). During program mode operations, a first set or a second set of specific bias conditions can be established on the gate structure of the VT-programmable transistor 225 (i.e., the VT-programmable transistor) and at least on one source/drain region of the VT-programmable transistor 225 (which is electrically connected to the stage output node 232) in order to perform either first VT programming (which as mentioned above is often referred to as a write process) or second VT programming (which as mentioned is often referred to as an erase process), respectively. During first VT programming, the VT-programmable transistor 225 can be programmed to have a first VT and, particularly, a low VT. During second VT programming, the VT-programmable transistor 225 can be programmed to have a second VT that is higher than the first VT and, particularly, a high VT.

The method embodiments can further include causing concurrent operation the PDLs in a delay mode (also referred to herein as a normal mode or mission mode) (see process 706). During delay mode operation, a data input signal is received at the input terminal 201, the data input signal is passed through the PDLs in sequence and inverted and delayed by each PDL and a delayed data output signal is output at the output terminal 202. If the VT-programmable transistor 225 in any given PDL has the first VT (i.e., the low VT), then in response to a specific gate voltage, which is applied to the gate structure of that VT-programmable transistor 225 and which is set at some level between the first and second VTs, the VT-programmable transistor 225 will switch to the on-state, thereby connecting the capacitor 213 to the stage output node 232 and adding a capacitance component to the RC delay in the particular stage. However, if the VT-programmable transistor 225 has the second VT (i.e., the high VT), then the VT-programmable transistor 225 will not switch to the on-state in response to the same specific gate voltage. This may cause capacitor 213 to remain disconnected from the stage output node 232, thus removing the capacitance component from the RC delay in that particular PDL.

FIG. 8A is a table illustrating the bias conditions and signal states during low VT and high VT program mode operations at process 704 and also during delay mode operation at process 706 within the programmable delay structure 200A of FIG. 2A, where the VT-programmable transistor 225 in each PDL is an N-type FEFET (e.g., as described above and illustrated in FIGS. 4A-4B) and where the first and second access devices 221-222 are first and second NFETs. For purposes of illustration, the first VT (i.e., the low VT) of the VT-programmable transistor 225 can be 0V and the second VT (i.e., the high VT) of the VT-programmable transistor 225 can be 1.5V, and where the first access device 221 and the second access device 222 are also NFETs (i.e., a first NFET and a second NFET).

As indicated in the table of FIG. 8A, during program mode operations at process 704, a PDL with the programmable delay structure 200A can be selectively and individually operated in the program mode for either first VT programming (i.e., for programming the VT-programmable transistor 225 therein to have a first VT and, particularly, a low VT) or second VT programming (i.e., for programming the VT-programmable transistor 225 therein to have a second VT and, particularly, a high VT). As discussed above with regard to FIGS. 4A-4B, for N-type FEFET programming to the first VT (i.e., the low VT), Vp in the range, for example, of 2.5V to 3.0V can be applied the gate structure and at least one source/drain region (e.g., the source/drain region connected to the stage output node 232) can be connected to GND; whereas, for N-type FEFET programming to the second VT (i.e., the high VT), the gate structure can be connected to GND and Ve can be applied to at least one source/drain region (e.g., the source/drain region connected to the stage output node 232). As mentioned above, Ve can be either the same as Vp or different from Vp but within the same range of, for example, 2.5V to 3.0V (e.g., Ve≥Vp).

To establish the proper bias conditions for first VT programming in any given PDL within the programmable delay structure 200A, the power supplied to the inverters 211 by the variable power supplies 215 can be set at Vp. Additionally, the programming input signal on the input terminal 201 can be switched so that Vp is also received at the stage input node 231 of the selected PDL undergoing first VT programming. For example, if PDL1 is selected for first VT programming, then the programming input signal at the input terminal 201 can be switched to Vp so that A1 is at Vp. However, if PDL2 is selected for first VT programming, then the programming input signal at the input terminal 201 can be switched to GND so that, following processing through the inverter of PDL1, A2 is at Vp. Additionally, for first VT programming in the selected PDL, the stage-specific program mode control signal (W) applied to the gate structure of the first access device 221 (first NFET) for the selected PDL can be switched to a relatively high positive voltage level equal to at least Vp plus the VT of that first access device 221, the stage-specific program mode control signals (W) applied to all other gate structures of all other first access devices 221 (all other first NFETs) for all other PDLs can be switched to a logic 0 (e.g., connected to GND), and the stage-specific delay mode control signals (R) applied to the gate structures of all second access devices 222 (all second NFETs) for all PDLs can also be switched to a logic 0. Thus, the first access device 221 (first NFET) of the PDL selected for first VT programming will switch to an on-state and all other first access devices 221 (all other first NFETs) of all other PDLs and all second access devices 222 (all second NFETs) of all PDLs will remain in off-states. As a result, within the PDL selected for first VT programming, Vp is applied to the gate structure of the VT-programmable transistor 225 via the first access device 221 (the first NFET) and GND is applied to a source/drain region thereof through the stage output node 232.

To establish the proper bias conditions for second VT programming in any given PDL within the programmable delay structure 200A, the power supplied to the inverters 211 by the variable power supplies 215 can set at Ve, which as mentioned above, is either the same as Vp or different from Vp (e.g., Ve≥Vp). Additionally, the programming input signal on the input terminal 201 can be switched so that Ve is not received at the stage input node 231 of the selected PDL undergoing second VT programming. For example, if PDL1 is selected for second VT programming, then the programming input signal at the input terminal 201 can be switched to GND so that A1 is at GND. However, if PDL2 is selected for second VT programming, then the programming input signal at the input terminal 201 can be switched to Ve so that, following processing through the inverter of PDL1, A2 is at GND. Additionally, for second VT programming in the selected PDL, the stage-specific program mode control signal (W) applied to the gate structure of the first access device 221 (the first NFET) for the selected PDL can be switched to a positive voltage level equal at least the VT of the first access device 221 (e.g., W could be VDD), the stage-specific program mode control signals (W) applied to the gate structures of all other first access devices 221 (all other first NFETs) for all other PDLs can be switched to a logic 0 (e.g., connected to GND), and the stage-specific delay mode control signals (R) applied to the gate structures of all second access devices 222 (all second NFETs) for all PDLs can also be switched to a logic 0. Thus, the first access device 221 (first NFET) of the PDL selected for second VT programming will switch to the on-stage and all other first access devices 221 (all other first NFETs) of all other PDLs and all second access devices 222 (all second NFETs) of all PDLs will remain in off-states. As a result, within the PDL selected for second VT programming, GND is applied to the gate structure of the VT-programmable transistor 225 via the first access device 221 (first NFET) and Ve is applied a source/drain region thereof at the stage output node 232.

Also, as illustrated in the table of FIG. 8A, during delay mode operation at process 706 in the programmable delay structure 200A of FIG. 2A, VDD can be supplied by the variable power supply 215 in each PDL to its respective inverter 211. Thus, when a data input signal (e.g., a logic 1 or a logic 0) is received at the input terminal 201 and passed through the PDLs in sequence such that it is inverted by each inverter 211, any logic 1 value output on a stage output node 232 by an inverter 211 will at VDD and, thus, too low to cause VT switching. Additionally, to ensure that each PDL adds the desired capacitance component to the RC delay in order to adjust the signal delay, during the delay mode operation, all stage-specific program mode controls signals (W) applied to the gate structures of the first access devices 221 (the first NFETs) of all PDLs can be switched to logic 0 (e.g., connected to GND) and all stage-specific delay mode control signals (R) applied to all gate structures of all second access devices 222 (all second NFETs) of all PDLs can be switched to a logic 1 (e.g., to VDD). As a result, the first access devices 221 in all PDLs will be in off-states and all second access devices 222 in all PDLs will be in on-states. Thus, the first positive voltage (e.g., VDD, such as 1.0V) from the power supply 216 (e.g., the fixed positive voltage rail) will be applied to the gate structures of the VT-programmable transistors 225 in all the PDLs through the second access devices 222. If the VT-programmable transistor 225 in a given PDL has the first VT (i.e., the low VT of, for example, 0V), then, in response to a gate voltage of 1.0V, the VT-programmable transistor 225 will switch to the on-state, thereby connecting the capacitor 213 of the PDL to the stage output node 232 and a capacitance component will be added to the RC delay in that given PDL. However, if the VT-programmable transistor 225 in a given PDL has the second VT (i.e., the high VT of, for example, 1.5V), then, in response to a gate voltage of 1.0V, the VT-programmable transistor 225 will not switch to the on-state and a capacitance component will not added to the RC delay in that given PDL.

It should be understood that the bias conditions and signal states for low VT and high VT program mode operations and for delay mode operation set forth in FIG. 8A and described above with regard to the programmable delay structure 200A of FIG. 2A (e.g., where the VT-programmable transistor 225 is an N-type FEFET and where the first and second access devices 221-222 are NFETs) are provided for illustration purposes and are not intended to be limiting.

Furthermore, it should be understood that the bias conditions and signal states and, more particularly, the values for Wx and Rx for low VT and high VT program mode operations and for delay mode operation will be different for the different programmable delay structures 200B-200F of FIGS. 2B-2F due to the different types of access devices 221-222 employed. That is, it should be understood that if the VT-programmable transistor 225 employed in the programmable delay structures 200B-200F is similarly an N-type FEFET, the same conditions, as discussed above with regard to FIGS. 2A and 8A, must be established on the gate structure of the VT-programmable transistor 225 and on the source/drain region of the VT-programmable transistor 225 for low VT program mode operation, high VT program mode operation, or delay mode operation. However, the stage-specific program mode control signal (Wx) and the stage-specific delay mode control signal (Rx) needed to establish those conditions can vary depending upon the type of access devices 221-222 employed.

Figure 2B:
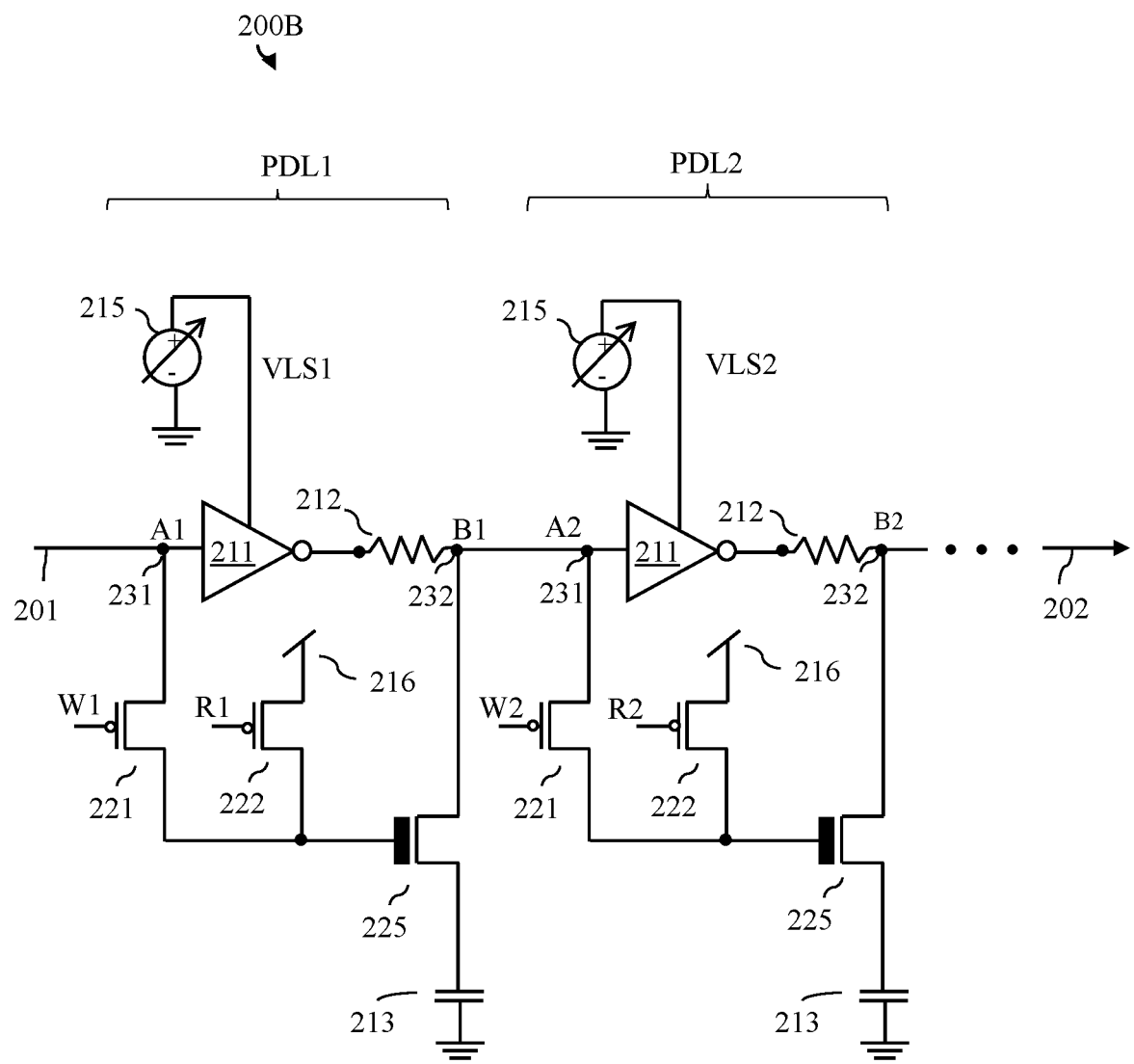
Figure 3:
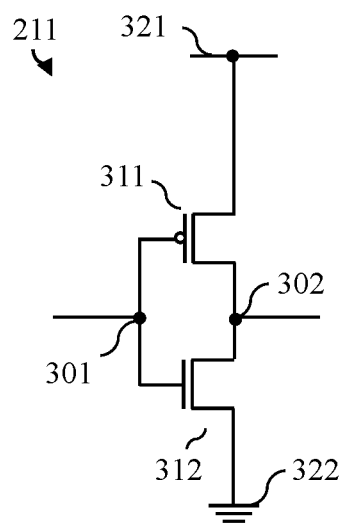
FIG. 3 is a schematic diagram illustrating an inverter that can be incorporated into a programmable delay stage (PDL)

For example, as illustrated in FIG. 8B, for a programmable delay structure 200B of FIG. 2B where the VT-programmable transistor 225 is an N-type FEFET and the first and second access devices 221-222 are first and second PFETs, low VT program mode operation could be achieved with Wx at ground and Rx at Vp, high VT program mode operation could be achieved with Wx at one VT below GND, and Rx at Vp, and delay mode operation could achieved with Wx at VDD and Rx at GND.

Figure 2C:
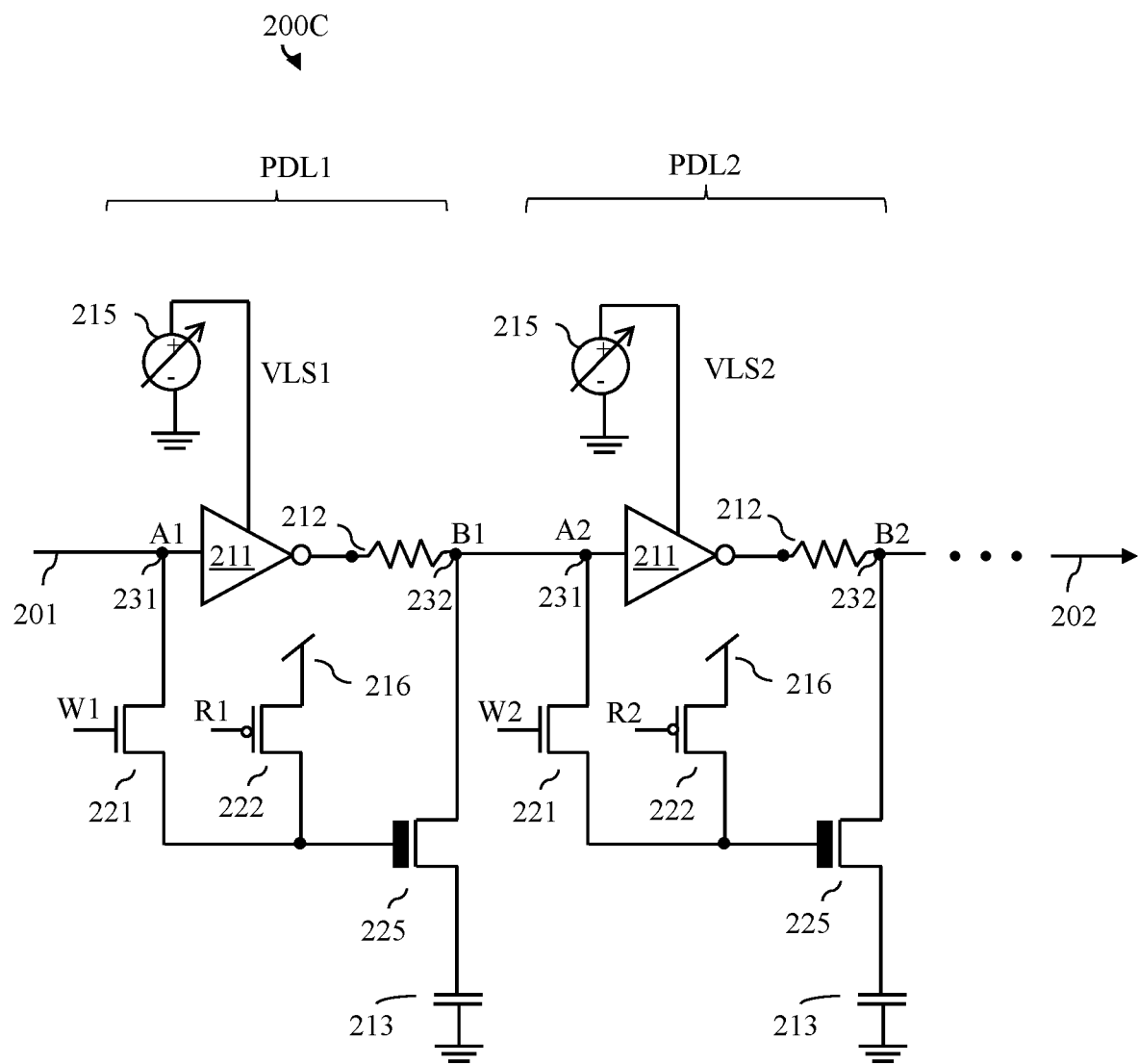

Alternatively, as illustrated in FIG. 8C, for a programmable delay structure 200C of FIG. 2C where the VT-programmable transistor 225 is an N-type FEFET, the first access device 221 is an NFET and the second access device 222 is a PFET, low VT program mode operation could be achieved with Wx at Vp plus the VT of the first access device 221 and Rx at Vp, high VT program mode operation could be achieved with Wx at VDD, and Rx at Vp, and delay mode operation could achieved with Wx and Rx at GND.

Figure 2D:
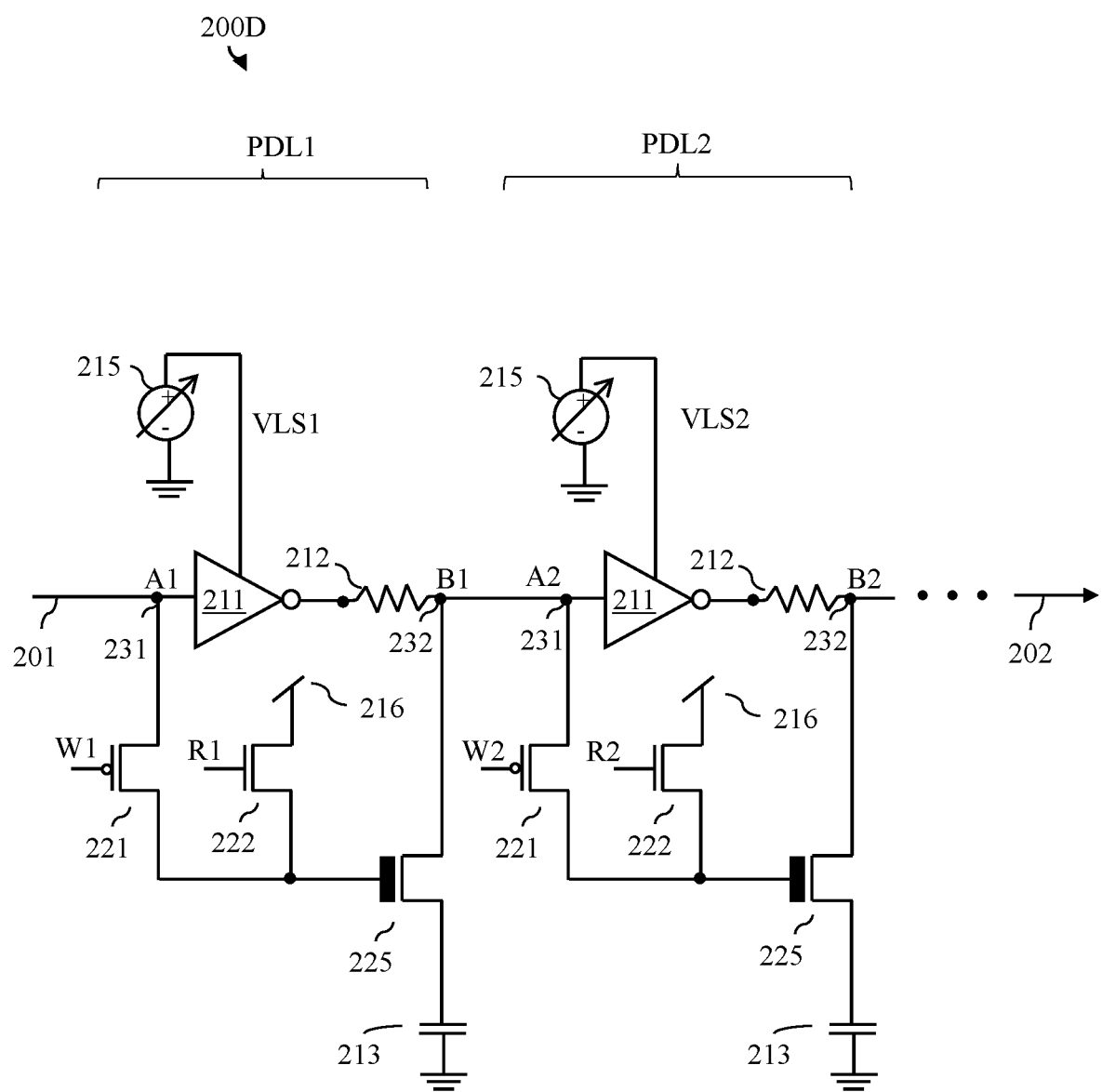

Alternatively, as illustrated in FIG. 8D, for a programmable delay structure 200D of FIG. 2D where the VT-programmable transistor 225 is an N-type FEFET, the first access device 221 is a PFET and the second access device 222 is an NFET, low VT program mode operation could be achieved with Wx and Rx at GND, high VT program mode operation could be achieved with Wx at one VT below GND, and Rx at GND, and delay mode operation could achieved with Wx and Rx at VDD.

Figure 2E:
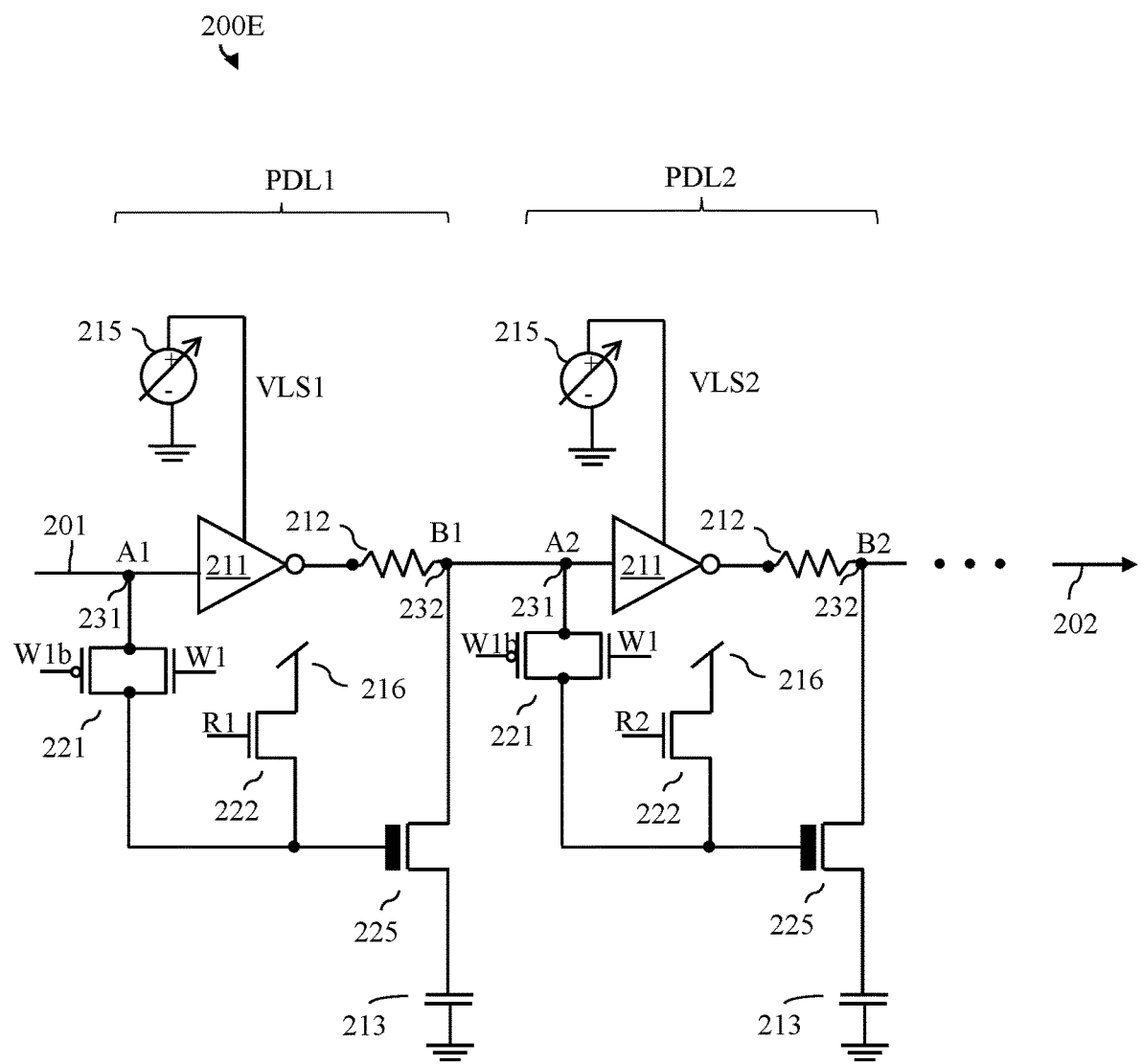

Alternatively, as illustrated in FIG. 8E, for a programmable delay structure 200E of FIG. 2E where the VT-programmable transistor 225 is an N-type FEFET, the first access device 221 is a CMOS-based switch (i.e., transmission gate with NFET controlled by Wx and PFET controlled by Wxb) and the second access device 222 is an NFET, low VT program mode operation could be achieved with Wx at Vp, Wxb at ground, and Rx at GND, high VT program mode operation could be achieved with Wx at VDD, Wxb at GND and Rx at GND, and delay mode operation could achieved with Wx at GND, Wxb at VDD, and Rx at VDD.

Figure 2F:
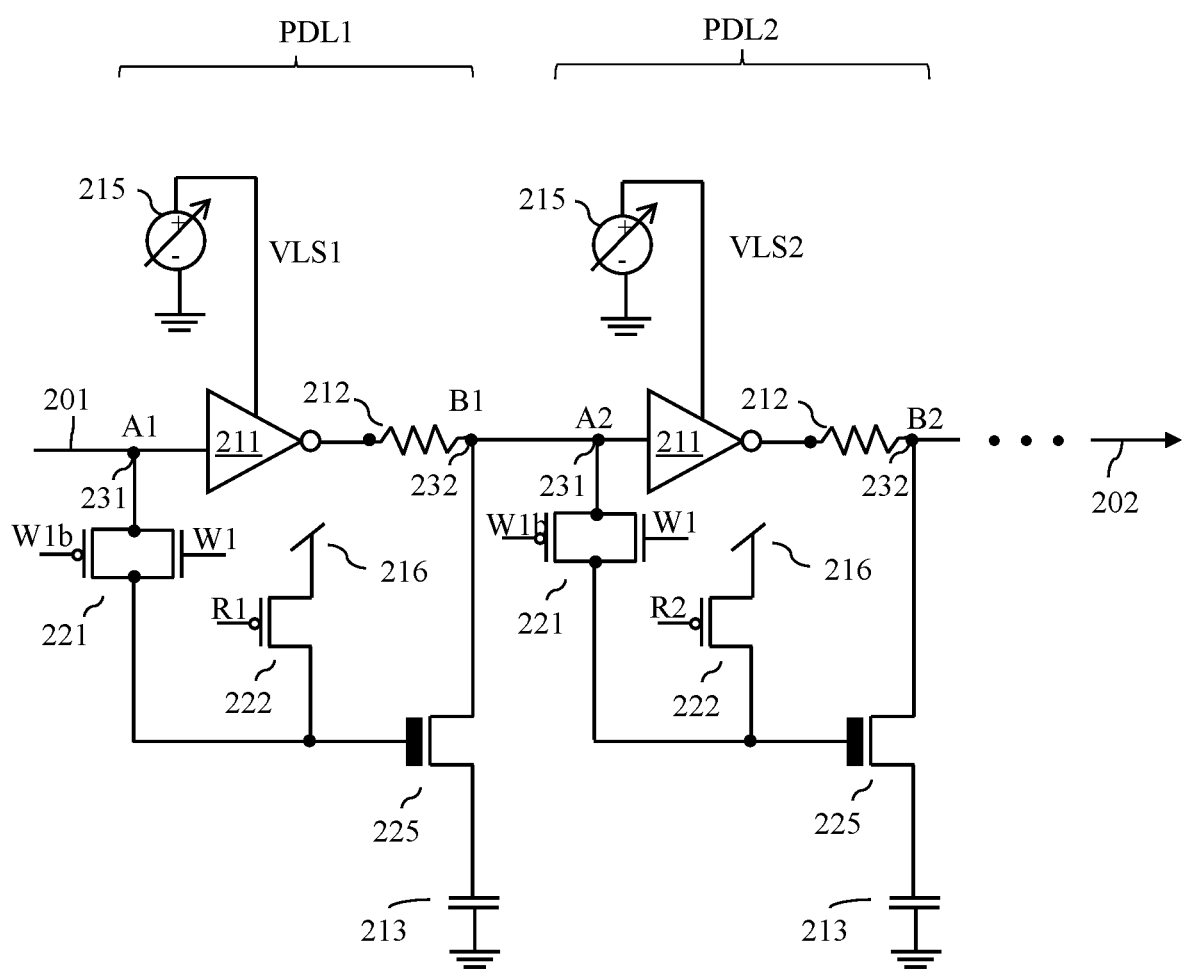

Alternatively, as illustrated in FIG. 8F, for a programmable delay structure 200F of FIG. 2F where the VT-programmable transistor 225 is an N-type FEFET, the first access device 221 is a CMOS-based switch (i.e., transmission gate with NFET controlled by Wx and PFET controlled by Wxb) and the second access device 222 is PFET, low VT program mode operation could be achieved with Wx at Vp, Wxb at ground, and Rx at Vp, high VT program mode operation could be achieved with Wx at VDD, Wxb at GND and Rx at Vp, and delay mode operation could achieved with Wx at GND, Wxb at VDD, and Rx at GND.

In any case, by selectively programming the VT of the VT-programmable transistor 225 in each PDL the disclosed programmable delay structure embodiments 200A-200F of FIGS. 2A-2F allow for the overall signal delay provided by the programmable delay structure 200A-200F to be selectively adjusted. For example, in the case of a programmable delay structure with three PDLs, eight overall signal delay amounts can be selected (e.g., all three with low VTs, all three with high VTs, and six other combinations thereof). Thus, by incorporating resistors with different resistance values and/or incorporating capacitors with different capacitance values, finer signal delay adjustment granularity is possible.

It should be understood that in the structures and method described above, a semiconductor material refers to a material whose conducting properties can be altered by doping with an impurity. Illustrative semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region. Furthermore, when a semiconductor region or layer is described as being at a higher conductivity level than another semiconductor region or layer, it is more conductive (less resistive) than the other semiconductor region or layer; whereas, when a semiconductor region or layer is described as being at a lower conductivity level than another semiconductor region or layer, it is less conductive (more resistive) than that other semiconductor region or layer.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises", "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
an input node;
an output node;
an inverter connected between the input node and the output node;
a threshold voltage-programmable field effect transistor;
a capacitor electrically connectable to the output node through the threshold voltage-programmable field effect transistor;
a first access device connected between the input node and a gate structure of the threshold voltage-programmable field effect transistor and controlled by a program mode control signal; and
a second access device connected between a power supply and the gate structure of the threshold voltage-programmable field effect transistor and controlled by a delay mode control signal.

2. The structure of claim 1, wherein the threshold voltage-programmable field effect transistor comprises any of ferroelectric field effect transistor and a charge trap field effect transistor.

3. The structure of claim 1, wherein the threshold voltage-programmable field effect transistor comprises source/drain regions connected to the output node and the capacitor, respectively.

4. The structure of claim 1, wherein the capacitor comprises any of a metal oxide semiconductor capacitor, a threshold voltage-programmable field effect transistor-based capacitor, a metal insulator metal capacitor, and a metal oxide metal capacitor.

5. The structure of claim 1, wherein the threshold voltage-programmable field effect transistor comprises an N-type ferroelectric field effect transistor.

6. The structure of claim 1, wherein the first access device and the second access device comprise any one of:
a first N-type field effect transistor and a second N-type field effect transistor, respectively;
a first P-type field effect transistor and a second P-type field effect transistor, respectively;
an N-type field effect transistor and a P-type field effect transistor, respectively;
a P-type field effect transistor and an N-type field effect transistor, respectively;
a transmission gate and an N-type field effect transistor, respectively; and
a transmission gate and a P-type field effect transistor, respectively.

7. The structure of claim 1, wherein the inverter comprises P-type and N-type field effect transistors connected in series between a variable power supply and ground, wherein the input node is connected to gate structures of the P-type and N-type field effect transistors, and wherein the output node is connected to a junction between the P-type and N-type field effect transistors.

8. A structure comprising:
an input terminal;
an output terminal; and
delay stages connected in a series between the input terminal and the output terminal,
wherein each delay stage of the delay stages comprises:
a stage input node;
a stage output node;
an inverter connected between the stage input node and the stage output node;
a threshold voltage-programmable field effect transistor;
a capacitor electrically connectable to the stage output node through the threshold voltage-programmable field effect transistor;
a first access device connected between the input node and a gate structure of the threshold voltage-programmable field effect transistor and controlled by a program mode control signal; and
a second access device connected between a power supply and the gate structure of the threshold voltage-programmable field effect transistor and controlled by a delay mode control signal, and
wherein the stage output node of one delay stage and the stage input node of an adjacent downstream delay stage are electrically connected.

9. The structure of claim 8, wherein the threshold voltage-programmable field effect transistor comprises any of ferroelectric field effect transistor and a charge trap field effect transistor.

10. The structure of claim 8, wherein the threshold voltage-programmable field effect transistor comprises source/drain regions connected to the stage output node and the capacitor, respectively.

11. The structure of claim 8, wherein the capacitor comprises any of a metal oxide semiconductor capacitor, a threshold voltage-programmable field effect transistor-based capacitor, a metal insulator metal capacitor, and a metal oxide metal capacitor.

12. The structure of claim 8, wherein the threshold voltage-programmable field effect transistor comprises an N-type ferroelectric field effect transistor.

13. The structure of claim 8, wherein the first access device and the second access device comprise any one of:
a first N-type field effect transistor and a second N-type field effect transistor, respectively;
a first P-type field effect transistor and a second P-type field effect transistor, respectively;
an N-type field effect transistor and a P-type field effect transistor, respectively;
a P-type field effect transistor and an N-type field effect transistor, respectively;
a transmission gate and an N-type field effect transistor, respectively; and
a transmission gate and a P-type field effect transistor, respectively.

14. The structure of claim 8, wherein at least two different delay stages have different capacitors with different capacitances.

15. A method comprising:
providing a structure comprising at least one delay stage comprising:
an input node;
an output node;
an inverter connected between the input node and the output node;
a threshold voltage-programmable field effect transistor; and
a capacitor electrically connectable to the output node through the threshold voltage-programmable field effect transistor;
a first access device connected between the input node and a gate structure of the threshold voltage-programmable field effect transistor and controlled by a program mode control signal; and
a second access device connected between a power supply at a first positive voltage and the gate structure of the threshold voltage-programmable field effect transistor and controlled by a delay mode control signal; and causing operation of the structure in a delay mode to invert a received signal at the input node and to output a delayed and inverted signal at the output node, wherein signal delay of the delayed and inverted signal is dependent upon a threshold voltage of the threshold voltage-programmable field effect transistor.

16. The method of claim 15, wherein the threshold voltage-programmable field effect transistor comprises any of a ferroelectric field effect transistor and a charge trap field effect transistor.

17. The method of claim 15, wherein the threshold voltage-programmable field effect transistor comprises an N-type ferroelectric field effect transistor.

18. The method of claim 15, wherein the causing of the operation of the structure in the delay mode comprises:

causing a variable power supply to supply the inverter with the first positive voltage so that, when the input node receives a ground voltage, the inverter switches the output node to the first positive voltage;

causing the program mode control signal to turn off the first access device; and causing the delay mode control signal to turn on the second access device so the first positive voltage is applied to the gate structure of the threshold voltage-programmable field effect transistor, wherein, when the threshold voltage-programmable field effect transistor has a first threshold voltage, the threshold voltage-programmable field effect transistor turns on in response to the first positive voltage, so the output node is connected to the capacitor and the signal delay is increased, and wherein, when the threshold voltage-programmable field effect transistor has a second threshold voltage that is higher than the first threshold voltage, the threshold voltage-programmable field effect transistor remains off in response to the first positive voltage, so the output node remains disconnected from the capacitor.

19. The method of claim 18, further comprising causing operation of the structure in a program mode, wherein the causing of the operation of the structure in the program mode comprises: causing operation of the structure in one of a first program mode to program the threshold voltage-programmable field effect transistor to have the first threshold voltage and a second program mode to program the threshold voltage-programmable field effect transistor to have the second threshold voltage.

20. The method of claim 19, wherein the causing of the operation of the structure in the first program mode comprises:

causing the input node to receive a second positive voltage that is higher than the first positive voltage, so the inverter switches the output node to the ground voltage;

causing the delay mode control signal to turn off the second access device; and causing the program mode control signal to turn on the first access device so that the second positive voltage is applied to the gate structure of the threshold voltage-programmable field effect transistor through the first access device, and wherein the causing of the operation of the structure in the second program mode comprises:

causing the variable power supply to supply the inverter with a third positive voltage that is greater than the first positive voltage;

causing the input node to receive the ground voltage so the inverter switches the output node to the third positive voltage;

causing the delay mode control signal to turn off the second access device; and causing the program mode control signal to turn on the first access device so that the ground voltage is applied to the gate structure of the threshold voltage-programmable field effect transistor through the first access device.

* * * * *